(12) United States Patent
Na et al.

(10) Patent No.: US 9,958,498 B2
(45) Date of Patent: May 1, 2018

(54) TEST HANDLER AND CIRCULATION METHOD OF TEST TRAYS IN TEST HANDLER

(71) Applicant: TECHWING CO., LTD., Hwaseong-si, Gyeonggi-do (KR)

(72) Inventors: Yun-Sung Na, Cheonan-si (KR); Young-Ho Kweon, Anseong-si (KR); Jong Ki Noh, Hwaseong-si (KR)

(73) Assignee: TECHWING CO., LTD., Hwaseong-si, Gyeonggi-Do (KR)

( * ) Notice: Subject to any disclaimer, the term of this patent is extended or adjusted under 35 U.S.C. 154(b) by 464 days.

(21) Appl. No.: 14/635,997

(22) Filed: Mar. 2, 2015

(65) Prior Publication Data

US 2015/0247895 A1    Sep. 3, 2015

(30) Foreign Application Priority Data

Mar. 3, 2014  (KR) .......................... 10-2014-0025058

(51) Int. Cl.
*G01R 31/28*   (2006.01)
*H01L 21/67*   (2006.01)

(52) U.S. Cl.
CPC ..... *G01R 31/2874* (2013.01); *G01R 31/2867* (2013.01); *H01L 21/67248* (2013.01)

(58) Field of Classification Search
CPC ............ G01R 31/2893; G01R 31/2862; G01R 31/2851; G01R 31/2855; G01R 31/2867; G01R 31/2872; G01R 31/2874; G01R 31/2875; G01R 31/2877; G01R 31/26; G01R 1/0408; H01L 21/67248
See application file for complete search history.

(56) References Cited

U.S. PATENT DOCUMENTS

| | | | |
|---|---|---|---|
| 7,538,542 B2 | 5/2009 | Shim et al. | |
| 2002/0011836 A1 | 1/2002 | Ito et al. | |
| 2006/0214655 A1 | 9/2006 | Ham et al. | |
| 2007/0176620 A1 | 8/2007 | Shim et al. | |
| 2007/0262783 A1* | 11/2007 | Hosaka | G01R 31/2893 324/750.15 |
| 2009/0167294 A1* | 7/2009 | Beom | G01R 31/2893 324/757.01 |
| 2009/0199395 A1* | 8/2009 | Shim | G01R 31/2893 29/650 |

(Continued)

FOREIGN PATENT DOCUMENTS

| | | |
|---|---|---|
| KR | 1997-0077466 | 12/1997 |
| KR | 1998-056230 | 9/1998 |

(Continued)

*Primary Examiner* — Son Le
*Assistant Examiner* — Dustin Dickinson
(74) *Attorney, Agent, or Firm* — Fenwick & West LLP

(57) ABSTRACT

In accordance with an embodiment of the present invention, there is provided a circulation method of a test tray in a test handler, the method comprising: in case of a first mode of test of temperature condition, firstly circulating the test tray along a first circulation path; and in case of a second mode of test of temperature condition different from the first mode, secondly circulating the test tray along a second circulation path, wherein the first circulation path and the second circulation path are different from each other in the transfer direction of the test tray at least in some sections.

10 Claims, 11 Drawing Sheets

(56) References Cited

U.S. PATENT DOCUMENTS

2014/0077829 A1\* 3/2014 Oh .................... G01R 31/2601
324/750.08

FOREIGN PATENT DOCUMENTS

| KR | 2000-0068397 | 11/2000 |
|----|--------------|---------|
| KR | 10-2005-0055685 | 6/2005 |
| KR | 20-0389824 | 7/2005 |
| KR | 10-0560729 | 3/2006 |
| KR | 10-0714106 | 4/2007 |
| KR | 10-2007-0077905 | 7/2007 |
| KR | 10-2007-0079223 | 8/2007 |
| KR | 20-2010-0012620 | 12/2010 |

\* cited by examiner

TEST HANDLER AND CIRCULATION METHOD OF TEST TRAYS IN TEST HANDLER

CROSS-REFERENCE TO RELATED APPLICATION

This application claims priority under 35 U.S.C. § 119(a) to Korean Patent Application No. 10-2014-0025058, which is incorporated by reference herein in its entirety.

FIELD OF THE INVENTION

The present invention relates to a test handler to be used for testing manufactured semiconductor devices.

BACKGROUND OF THE INVENTION

A test handler is used for testing semiconductor devices which are manufactured through a predetermined manufacturing process.

The test handler transfers the semiconductor devices from a customer tray to a test tray, supports the semiconductor devices mounted on the test tray to be tested at the same time by a tester, and transfers the semiconductor devices from the test tray to the customer tray while classifying the semiconductor devices by degrees according to the test results.

The above mentioned test tray circulates along the constant circulation path leading from a position where the semiconductor devices are loaded on the test tray (hereinafter referred to as a loading position), a position where the mounted semiconductor devices are electrically connected to the tester (hereinafter referred to as a test position), and a position where the semiconductor devices finished in testing are unloaded from the test tray (hereinafter referred to as an unloading position) to the loading position again.

In general, in consideration of the use environment of the semiconductor devices, the semiconductor devices are applied by a thermal stimulus (hot or cold), and afterwards, when the test is finished, the semiconductor devices are released from the thermal stimulus. At this time, the process of applying and releasing the thermal stimulus is made on the circulation path of the test tray.

In the above mentioned test handler, there are two types, one is a side docking type (see Korean Patent Laid-Open Publication No. 10-1997-0077466) in which the test tray is electrically connected to the tester in a vertically erected state, and the other is an under head docking type (see Korean Patent Laid-Open Publication No. 10-2000-0068397) in which the test tray is electrically connected to the tester in a horizontal state. In both of the docking type test handler and the under head docking type test handler, the test tray circulates along the constant circulation path. However, in case of the side docking type test handler compared to the under head docking type test handler, the following process is required. That is, the test tray in a horizontal state which is finished in loading for the semiconductor devices to be tested is required to be erected vertically, or the test tray which is finished in unloading for the semiconductor devices finished in testing is required to return to the horizontal state. Further a position converter for the above process is required (see Korean Registered Patent No. 10-0714106).

FIG. 1 is a conceptual plan view of a side docking type test handler 100 of the above described types of test handlers.

The test handler 100 includes a test tray 110, a loading unit 120, a first position converter 130, a soak chamber 140, a test chamber 150, a pressure device 160, a desoak chamber 170, a second position converter 180, an unloading unit 190, a plurality of thermo-regulators (TC1 to TC6) and a controller (CU).

As disclosed in Korean Registered Utility Model No. 20-0389824, a plurality of semiconductor devices may be loaded in the test tray 110 and circulates along the predetermined circulation path (C) by a plurality of transporters (not shown).

The loading unit 120 loads the semiconductor devices to be tested which are mounted on the customer tray (Cd) on the test tray 110 located at the loading position (LP). Such the loading unit 120 may be composed of a pick and place system alone as disclosed in Korean Utility Model Laid-Open Publication No. 20-2010-0012620, but also may be composed of a plurality of pick and place systems and a movable loading table as disclosed in Korean Patent Laid-Open Publication No. 10-2007-0077905.

The first position converter 130 converts the test tray 110 transferred from the loading position (LP) from a horizontal state of position to a vertical state of position.

The soak chamber 140 is provided to apply a thermal stimulus to the semiconductor devices mounted on the test tray 110, prior to testing, depending on the temperature condition of test. In other words, the semiconductor devices previously assimilate to the temperature of the inside of the soak chamber 140, before transferring to the test position (TP). Accordingly, the entire logistics flow goes faster and the processing capacity is enhanced. Here, the test tray 110 is transferred in parallel in the inside of the soak chamber 140.

For reference, the first position converter 130 may be composed in the inside or the outside of the soak chamber 140. In other words, the test tray 110 in the horizontal state may be implemented so as to be converted to the vertical state of position in the inside of the soak chamber 140, and after converting to the vertical state of position, may be implemented so as to be capable of entering into the inside of the soak chamber 140.

The test chamber 150 is provided to test the semiconductor devices mounted on the test tray 110 which is transferred to the test position (TP), after receiving the thermal stimulus in the soak chamber 140. The inside of the test chamber 150 is always similar in thermal state as the inside of the soak chamber 140, and thus both insides are communicated each other. For reference, the tester is coupled toward the window of the test chamber 150.

The pressure device 160 pressurizes the semiconductor devices mounted on the test tray 110 toward the tester (see Korean Patent Laid-Open Publication No. 10-2005-0055685), and thereby the semiconductor devices mounted on the test tray 110 are electrically connected to the tester.

The desoak chamber 170 is provided to release the thermal stimulus from the semiconductor devices mounted on the test tray 110 transferred from the test chamber 150. The reason why the desoak chamber 170 is configured as above is to ensure that when the semiconductor devices finished in testing are unloaded from the test tray 110, a normal unloading operation can be carried out, and also is to prevent the unloading unit 190 from being damaged or to prevent the merchantability of the semiconductor devices from being deteriorated. As the temperature of the inside of desoak chamber 170 and the temperature of the inside of the test chamber 150 are different from each other, an opening and closing door (DR) is required to open and close between the desoak chamber 170 and the test chamber 150. Likewise, the test tray 110 is transferred in parallel in the inside of the desoak chamber 170.

The second position converter 180 converts the test tray 110 having the semiconductor devices finished in testing from the vertical state of position to the horizontal state of position. Likewise, the second position converter 180 may be composed in the inside or the outside of the desoak chamber 170.

The unloading unit 190 classifies the semiconductor devices by test degrees and mounts the semiconductor devices to the empty customer tray (Ce) while unloading the semiconductor devices mounted on the test tray 110 which is placed in the unloading position (UP), after being converted to the horizontal state of position. Likewise, the unloading unit 190 may be composed of a pick and place system alone, but also may be composed of a plurality of pick and place systems, a sorting table and the like, as disclosed in Korean Patent Laid-Open Publication No. 10-2007-0079223.

The plurality of thermo-regulators (TC1 to TC6) controls a temperature in the inside of the soak chamber 140, a temperature of the inside of the test chamber 150 and a temperature of the inside of the desoak chamber 170. Here, as the inside of the test chamber 150 is directly related to the temperature condition of the semiconductor devices to be tested, a precise temperature control must be made and also any change of temperature that may occur during the test must be quickly suppressed. Therefore, multiple thermo-regulators (TC3 to TC6) are required.

The controller (CU) controls components which need to be controlled among the above mentioned components.

As can be seen from the above, the test tray 110 circulates along the closed circulation path (C) leading from the loading position (LP), the inside of the soak chamber 140, the test position (TP) in the inside of the test chamber 150 and the inside of the desoak chamber 170 to the loading position (LP).

As disclosed in Korean Patent Laid-Open Publication No. 10-1998-056230 and Korean Registered Patent No. 10-0560729, even if the same side docking type handler is used, depending on the embodiment, there may be a implemented a side docking type handler in a way that the loading position and the unloading position are same, the conversion of position of the test tray is made in one position converter, and the operation of loading and unloading is made by the same components. In this case, the test tray circulates along the closed circulation path leading from the loading/unloading position, the soak chamber, the test chamber and the desoak chamber to the loading/unloading position.

Meanwhile, as the use environment of the semiconductor device will vary, the temperature condition of test may be a low temperature (e.g., −40° C.) or a high temperature (e.g., 90° C.). Therefore, it may be required that after the low temperature test, the high temperature test is carried out, or after the high temperature test, the low temperature test is carried out. For example, the inside of the soak chamber 140 may be adjusted to −40° C., and the inside of the desoak chamber 170 may be adjusted to 70-80° C. so as for the semiconductor devices to return to the room temperature. After the low temperature test is carried out under the above state, the high temperature test by the temperature condition of 90° C. must be carried out. In this case, the temperature of the inside of the soak chamber 140 must be adjusted to 90° C., and the temperature of the inside of the desoak chamber 170 must be decreased so as for the semiconductor devices to return the room temperature (e.g., from 70-80° C. to the room temperature). In this case, as it is required several hours (e.g., 2 hours) for the temperature of the inside of the soak chamber 140 to be increased from −40° C. up to 90° C. and the temperature of the inside of the desoak chamber 170 to be decreased, the waiting time for the test handler becomes longer, and thereby the operating rate and the processing capacity become lower. This problem occurs even in the case as well that the procedure is changed in a way of first high temperature test and next low temperature test.

For reference, in case of the test chamber 150, the internal space thereof is small, and the thermo-regulators (TC2 to TC5) are provided sufficiently, and thereby it is capable of quickly coping with any change of the temperature condition of test.

SUMMARY OF THE INVENTION

In view of the above, the present invention provides a technique to minimize the waiting time of the test handler when the temperature conditions of test vary greatly.

In accordance with an embodiment of the present invention, there is provided a test handler comprising: a test tray for circulating along a first circulation path or a second circulation path, depending on the temperature condition of test, the test tray having semiconductor devices mounted thereon; a device transfer portion for transferring the semiconductor devices to be tested from a customer tray to the test tray located at a loading position, or transferring the semiconductor devices finished in testing from the test tray located at an unloading position to the customer tray by classifying the semiconductor devices according to the test result; a plurality of transporters for circulating the test tray having the semiconductor devices to be tested mounted thereon along the first circulation path or the second circulation path by the operation of the device transfer portion; a first chamber for accommodating the test tray circulating along the first circulation path or the second circulation path by the plurality of transporters, the first chamber being provided to assimilate the semiconductor devices mounted on the test tray to a temperature corresponding to a first temperature condition according to the set first temperature condition; at least one or more first thermo-regulators for assimilating the inside of the first chamber to the first temperature condition; a second chamber for accommodating the test tray circulating along the first circulation path or the second circulation path by the plurality of transporters, the second chamber being provided to assimilate the semiconductor devices mounted on the test tray to a temperature corresponding to a second temperature condition according to the set second temperature condition; at least one or more thermo-regulators for assimilating the inside of the second chamber to the second temperature condition; a test chamber which is disposed between the first chamber and the second chamber on the first circulation path and the second circulation path, the test chamber being provided for supporting tests of the semiconductor devices mounted on the test tray accommodated therein; at least one or more third thermo-regulators for assimilating the inside of the test chamber to a temperature condition of test; and a controller for controlling the plurality of transporters so as for the test tray to circulate along the first circulation path or the second circulation path, wherein the first temperature condition and the second temperature condition vary respectively according to the settings, and the first temperature condition and the second temperature condition are different from each other, and, wherein the first circulation path and the second circulation path are different from each other in the transfer direction of the test tray at least in some sections.

Further, the first circulation path has a section where the test tray passes through the inside of the first chamber, the inside of the test chamber and the inside of the second chamber sequentially, and the second circulation path has a section where the test tray passes through the inside of the second chamber, the inside of the test chamber and the inside of the first chamber sequentially.

Further, the second circulation path has a bypass section where the test tray is transferred from the loading position to the inside of the second chamber, and at least one or more bypass transporters for transferring the test tray from the loading position to the inside of the second chamber are included among the plurality of transporters.

Further, the bypass section is a section where the test tray is transferred from the loading position to the inside of the second chamber via the inside of the first chamber, the first chamber is equipped with a taking-out door which opens and closes a taking-out hole where the test tray is taken out from the first chamber at the bypass section, and the second chamber is equipped with a taking-in door which opens and closes a taking-in door where the test tray is taken in to the second chamber at the bypass section.

Further, the test handler further comprises: a first opening and closing door which is provided for cross communicating or blocking the inside of the first chamber and the inside of the test chamber, and a second opening and closing door which is provided for cross communicating or blocking the inside of the test chamber and the inside of the second chamber.

In accordance with an embodiment of the present invention, there is provided a circulation method of a test tray in a test handler, the method comprising: in case of a first mode of test of temperature condition, firstly circulating the test tray along a first circulation path; and in case of a second mode of test of temperature condition different from the first mode, secondly circulating the test tray along a second circulation path, wherein the first circulation path and the second circulation path are different from each other in the transfer direction of the test tray at least in some sections.

Further, the first circulation path has a section where the test tray passes through an inside of a first chamber, an inside of a test chamber and an inside of a second chamber sequentially, and the second circulation path has a section where the test tray passes through the inside of the second chamber, the inside of the test chamber and the inside of the first chamber sequentially.

Further, the second circulation path has a bypass section where the test tray is transferred from a loading position (a position where semiconductor devices are loaded on the test tray) to the inside of the second chamber without passing through the inside of the test chamber, and an unloading transfer section where the test tray is transferred from the first chamber to an unloading position (a position where semiconductor devices are unloaded from the test tray) without passing through the inside of the test chamber.

Further, at least a portion of the portions where the transfer directions of the test tray are same in the bypass section and the unloading transfer section are spaced apart from each other.

In accordance with an embodiment of the present invention, there is provided a test handler comprising: a test tray having the semiconductor devices mounted thereon, wherein the test tray is configured to be transferred along a first circulation path in a first mode where semiconductor devices are tested by a first temperature, and be transferred along a second circulation path in a second mode where the semiconductor devices are tested by a second temperature different from the first temperature; a device transfer portion for transferring the semiconductor devices to be tested from a customer tray to the test tray, or transferring the semiconductor devices finished in testing from the test tray to the customer tray; a plurality of transporters for transferring the test tray; a controller for controlling the plurality of transporters; a first chamber and a second chamber for controlling a temperature of the semiconductor devices mounted on the test tray; and a test chamber in which the semiconductor devices are tested, the test chamber being provided between the first chamber and the second chamber, wherein the first mode and the second mode are made continuously.

Further, the first circulation path has a section where the test tray passes through the inside of the first chamber, the inside of the test chamber and the inside of the second chamber sequentially, and the second circulation path has a section where the test tray passes through the inside of the second chamber, the inside of the test chamber and the inside of the first chamber sequentially.

Further, in case of the first mode of test, the first chamber is adjusted to the first temperature, and the second chamber is adjusted to a temperature which is required for the semiconductor devices to return from the first temperature to a room temperature, and in case of the second mode of test after the first mode of test, the second chamber is adjusted to the second temperature, and the first chamber is adjusted to a temperature which is required for the semiconductor devices to return from the second temperature to the room temperature.

Further, the difference between the temperature which is required for the semiconductor devices to return from the first temperature to the room temperature and the second temperature is smaller than the difference between the first temperature and the second temperature.

In accordance with the present invention, the waiting time of the test handler due to the fluctuations of the set temperature of test is reduced drastically, and thereby the operating rate and the processing capacity of the test handler are enhanced.

BRIEF DESCRIPTION OF THE DRAWINGS

The above and other objects and features of the present invention will become apparent from the following description of the embodiments given in conjunction with the accompanying drawings, in which.

DETAILED DESCRIPTION OF THE EMBODIMENTS

Hereinafter, embodiments in accordance with the present invention will be described with reference to the accompanying drawings, but for the sake of briefness, redundant description will be omitted or compressively described.

First Embodiment

Figure 1:
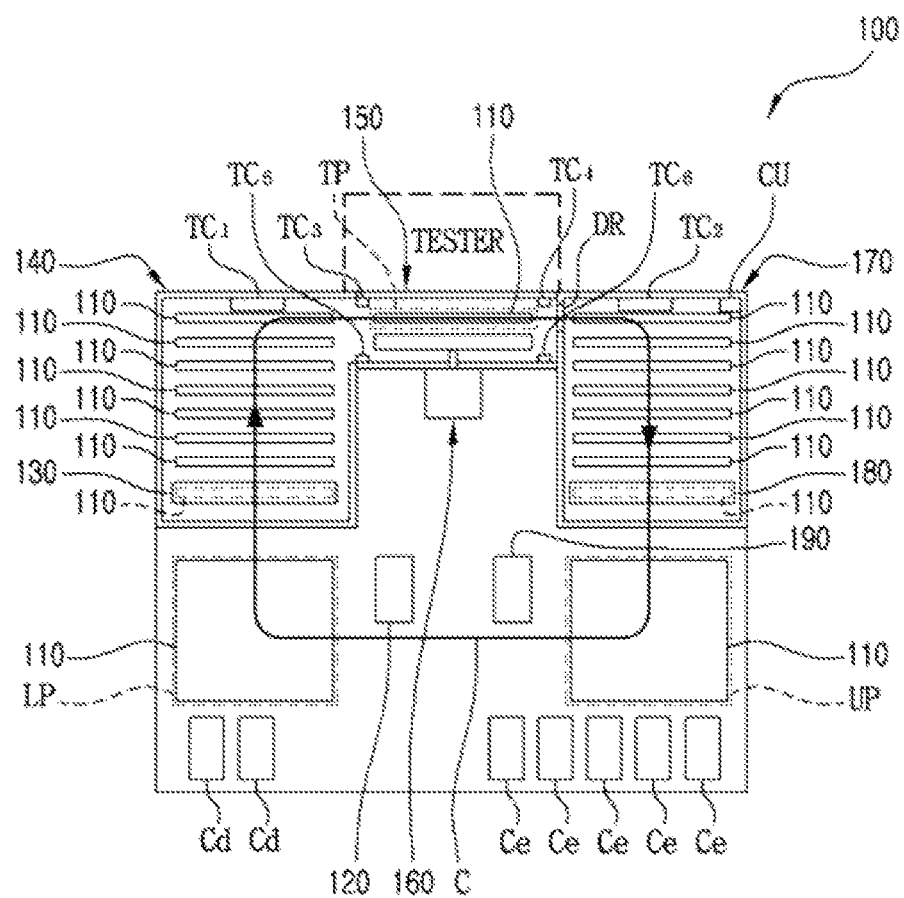
FIG. 1 is a conceptual plan view of a conventional test handler.
Figure 2:
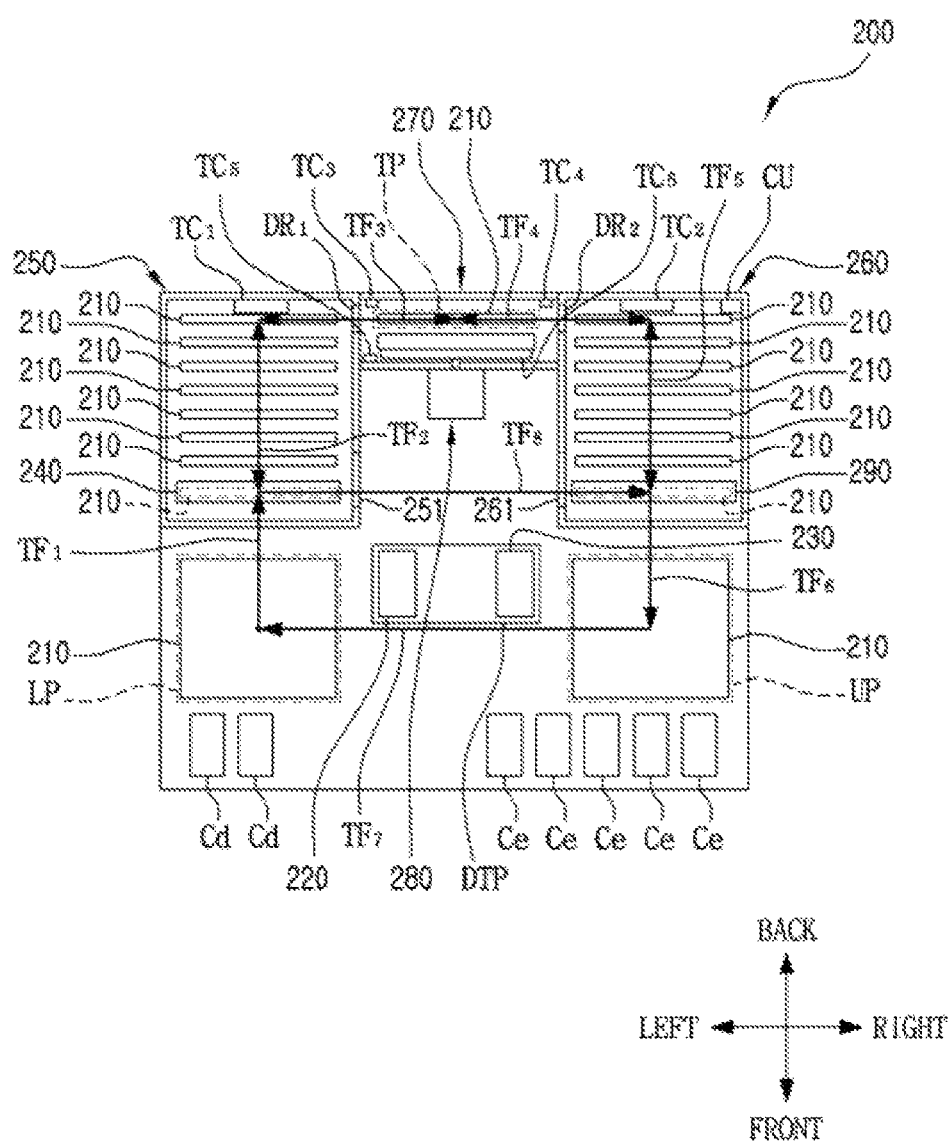
FIG. 2 is a conceptual plan view of the test handler in accordance with a first embodiment of the present invention.

FIG. 2 is a conceptual plan view of a test handler 200 in accordance with the present invention.

As shown in FIG. 2, the test handler 200 includes a test tray 210, a loading unit 220, an unloading unit 230, a first position converter 240, a first chamber 250, a second chamber 260, a test chamber 270, a pressure device 280, a second position converter 290, a plurality of transporters (TF1 to TF8), a plurality of thermo-regulators (TC1 to TC6) and a controller (CU).

The test tray 210 circulates along a first circulation path (C1 in FIG. 3) or a second circulation path (C2 in FIG. 4), depending on the temperature condition of test. Here, the first circulation path (C1) is a closed path leading from a loading position (LP), an inside of the first chamber 250, a test position (TP) in the inside of the test chamber 270, an inside of the second chamber 260 and an unloading position (UP) to the loading position (LP). The second circulation path (C2) is a path which is used when the temperature condition of test varies greatly, which will be described in detail later.

The loading unit 220 loads the semiconductor devices to be tested which are mounted on the customer tray (Cd) on the test tray 210 located at the loading position (LP).

The unloading unit 230 classifies the semiconductor devices by test degrees and mounts the semiconductor devices on the empty customer tray (Ce) while unloading the semiconductor devices mounted on the test tray 210 located at the unloading position (UP).

As mentioned above, the loading unit 220 and the unloading unit 230 are configured so as for the semiconductor devices to be transferred between the test tray 210 and the customer tray (Cd/Ce). Furthermore, in case of adapting the configuration of the test handler such as in Korean Patent Laid-Open Publication No. 10-1998-056230, there is no distinction between the loading unit and the unloading unit, and therefore both of the loading unit 220 and the unloading unit 230 may be collectively referred to as a device transfer portion (DTP).

Figure 5:
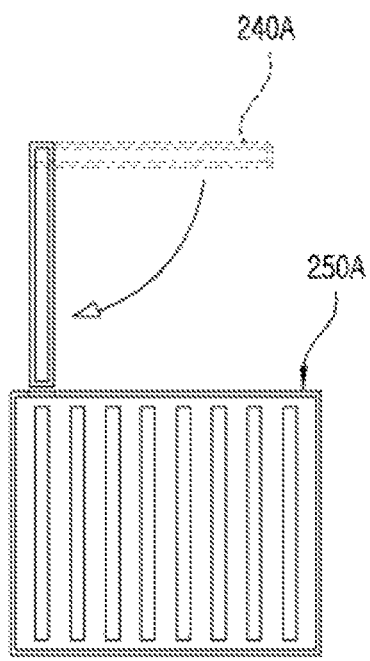

The first position converter 240 converts the test tray 210 from the horizontal state of position to the vertical state of position. In the present embodiment, the first position converter 240 is equipped in the inside of the first chamber 250, but as shown in FIG. 5, the first position converter 240A may be equipped in the outside of the first chamber 250A, depending on the embodiment.

In the first chamber 250, the semiconductor devices mounted on the test tray 210 assimilates to the temperature corresponding to a set temperature condition (hereinafter, the set temperature condition of the inside of the first chamber is referred as a first temperature condition). Depending on which circulation path the test tray 210 takes between the first circulation path (C1) or the second circulation path (C2), the first chamber 250 takes a function as a soak chamber or as a desoak chamber. The first chamber 250 is equipped with a taking-out door 251 which opens and closes a taking-out hole in which the test tray 210 converted to the vertical state of position by the first position converter 240 can be directly taken out toward the second chamber 260 without passing through the test chamber 270. Of course, the test tray 210 may be transferred in parallel in the forward and backward direction within the first chamber 250.

In the second chamber 260, the semiconductor devices mounted on the test tray 210 assimilates to the temperature corresponding to a set temperature condition (hereinafter, the set temperature condition of the inside of the second chamber is referred as a second temperature condition). Depending on which circulation path the test tray 210 takes between the first circulation path (C1) or the second circulation path (C2), the second chamber 260 takes a function as a soak chamber or as a desoak chamber. The second chamber 260 is equipped with a taking-in door 261 which opens and closes a taking-in hole in which the test tray 210 can be directly taken in from the first chamber 250 without passing through the test chamber 270. Likewise, the test tray 210 may be transferred in parallel in the forward and backward direction within the second chamber 260.

The first temperature condition or the second temperature condition is a parameter that may be set in consideration of a temperature environment of test by an administrator and thus may be a changeable factor. Of course, if the first temperature condition is the temperature condition for applying a thermal stimulus to the semiconductor devices, the second temperature is a temperature condition for releasing the thermal stimulus from the semiconductor devices, and if the second temperature is a temperature for applying a thermal stimulus to the semiconductor devices, the first temperature condition is a temperature condition for releasing the thermal stimulus from the semiconductor devices. Therefore, the first temperature condition and the second temperature condition must be different from each other.

The test chamber 270 supports tests of the semiconductor devices mounted on the test tray 210 located at the test position (TP) in the inside of the test chamber 270. The test chamber 270 is disposed between the first chamber 250 and the second chamber 260 on the first circulation path (C1) and the second circulation path (C2).

The inside of the first chamber 250 and the inside of the test chamber 270 may be blocked or cross-communicated each other by the first opening and closing door (DR1), and the inside of the second chamber 260 and the inside of the test chamber 270 may be blocked or cross-communicated each other by the second opening and closing door (DR2).

The pressure device 280 pressurizes the semiconductor devices mounted on the test tray 210 within the test chamber 270 toward the tester. Because of this, the semiconductor devices mounted on the test tray 210 are electrically connected to the tester.

The second position converter 290 converts the test tray 210 having the semiconductor devices mounted thereon from the vertical state of position to the horizontal state of position. Likewise, in the present embodiment, the second position converter 290 is equipped in the inside of the second chamber 260, but depending on the embodiment, the second position converter may be configured so as to be equipped in the outside of the second chamber.

A plurality of transporters (TF1 to TF8) transports the test tray 210 on each section on the first circulation path (C1) and the second circulation path (C2). Of course, besides the plurality of transporters (TF1 to TF8), additional transporter necessary for the transfer flow of the test tray 210 may be further provided.

In particular, a transporter (TF8) is a bypass transporter which is used for transporting the test tray 210 located at the loading position (LP) to the inside of the second chamber 270 without passing through the test chamber 270. A transporter (TF2) and a transporter (TF5) may transfer in parallel the test tray 210 in both directions of the forward and the backward. Also, a transporter (TF3) and a transporter (TF4) may transfer in parallel the test tray 210 in both directions of the left and the right.

The plurality of thermo-regulators (TC1 to TC6) adjusts a temperature of the insides of the first chamber 250, a temperature of inside of the second chamber 260 and a temperature of the inside of the test chamber 270. A thermo-regulator (TC1) adjusts the temperature of the inside of the first chamber 250, to thermo-regulator (TC2) adjusts the temperature of the inside of the second chamber 260, and thermo-regulators (TC3 to TC6) adjust the temperature of the inside of the test chamber 270. Here, each of the plurality of thermo-regulators (TC1 to TC6) may be a cooler, a heater, a blower and a combination thereof. In particular, a thermo-regulator (TC6) is preferred to have the structure, for example, disclosed in Korean Patent Application No. 10-2013-0013988 filed by the applicant of the present application. For reference, in case of the blower, the external air having the room temperature is blown into the inside of the chamber, and the air in the inside of the chamber applied by the thermal stimulus is removed to the outside. In such a way of approaching the temperature of the inside of the chamber to the room temperature, the temperature of the inside of the chamber is adjusted to a pre-set temperature (e.g., room temperature).

The controller (CU) controls components required for controlling among the above mentioned components. In particular, the controller (CU) may perform a first mode control and a second mode control, depending on the temperature condition of test. In the first mode control, the transporters (TF1 to TF7) are controlled so as for the test tray 210 to circulate along the first circulation path (C1), and in the second mode control, the transporters (TF1 to TF8) are controlled so as for the test tray 210 to circulate along the second circulation path (C2).

It will be continued to describe with respect to the circulation method of the test tray taking place in the test handler 200 having the above mentioned configuration.

1. Circulation of the Test Tray 210 in Case of the First Test Mode.

In case of the first test mode where the semiconductor devices are tested by the first temperature (the test of the temperature condition of the first mode, considering the low temperature of test mode, e.g., −40° C.), the inside of the first chamber 250 must be adjusted to −40° C., and the inside of the second chamber 260 must be adjusted to 70° C.-80° C.

For reference, in case where the inside of the second chamber 260 is adjusted to 70-80° C., in consideration of the circulating time of the test tray 210, the temperature of the semiconductor devices mounted on the test tray 210 which exits from the second chamber 260 and is transferred to the unloading position (UP) is in the range of 15 to 20° C. close to the room temperature.

Figure 3:
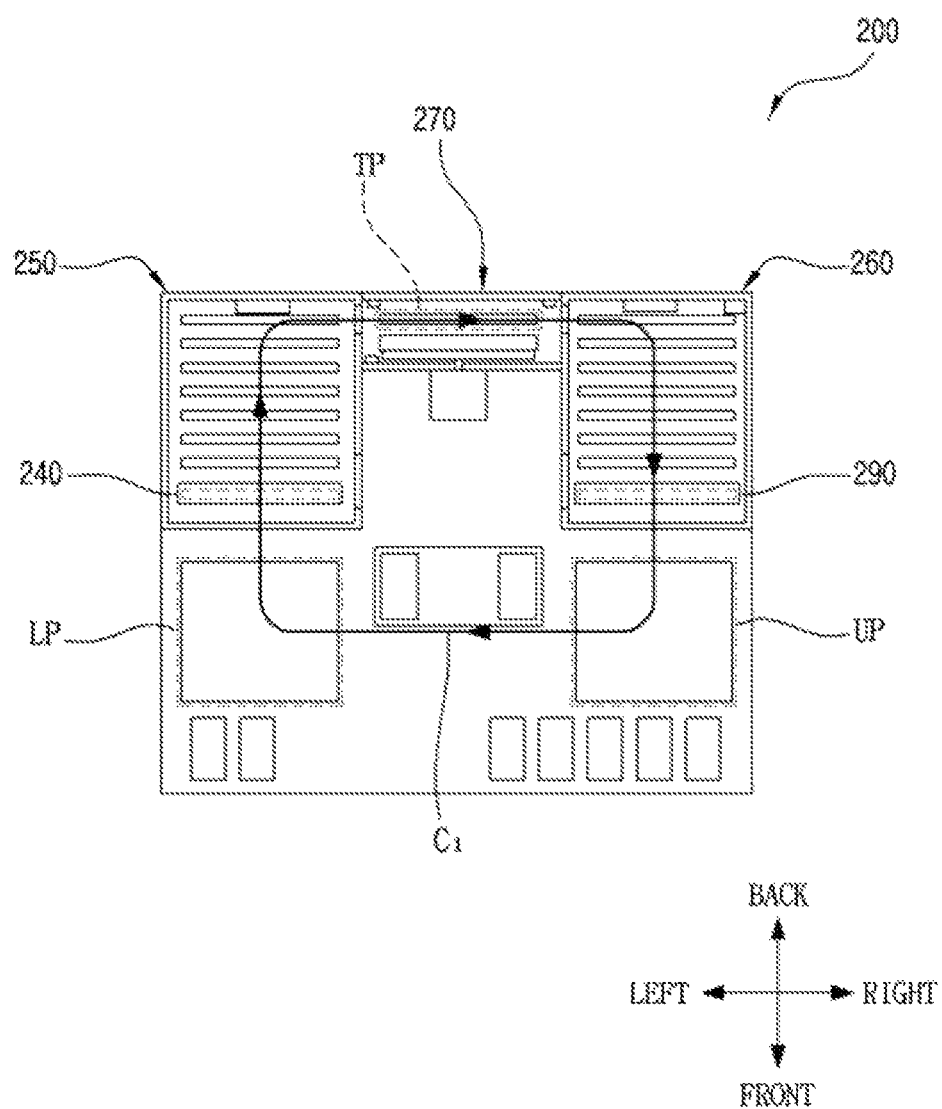
FIG. 3 to FIG. 9 are reference views illustrating a circulation path of a test tray of the test handler of FIG. 1.

In the above situation of set temperature, as referenced in FIG. 3, the test tray 210 circulates along the first circulation path (C1) leading from the loading position (LP), the inside of the first chamber 250, (the test tray 210 is transferred in parallel from the inside of the first chamber 250 to the backward), the test position (TP) in the inside of the test chamber 270, the inside of the second chamber 260, <the test tray 210 is transferred in parallel from the inside of the second chamber 260 to the forward>, and the unloading position (UP) to the loading position (LP) sequentially. At this time, the test tray 210 is experienced by the step of being converted from the horizontal state of position to the vertical state of position by the first position converter 240 in the inside of the first chamber 250, and being converted from the vertical state of position to the horizontal state of position by the second position converter 290 in the inside of the second chamber 260.

In case of the circulation of the test tray 210 taking the above mentioned first circulation path (C1), the first chamber 250 has a function as a soak chamber, and the second chamber 260 has a function as a desoak chamber. Therefore, the test tray 210 has sections passing through the first chamber 250, the test chamber 270 and the second chamber 260 sequentially, and the semiconductor devices assimilated to the low temperature while passing through the first chamber 250 are tested by the tester in the inside of the test chamber 270 and then return to the room temperature while passing through the second chamber 260.

2. Circulation of the Test Tray 210 in Case of the Second Test Mode.

In case of the second test mode where the semiconductor devices are tested by the second temperature (the test of the temperature condition of the second mode, considering the high temperature of test mode, e.g., 90° C.), the inside of the second chamber 260 is adjusted to 90° C. Therefore, the waiting time required for increasing the temperature which is already in the range of 70° C.-80° C. in the inside of the second chamber 260 up to 90° C. is significantly reduced within less than three minutes, and thereby energy saving is also achieved.

Figure 4:
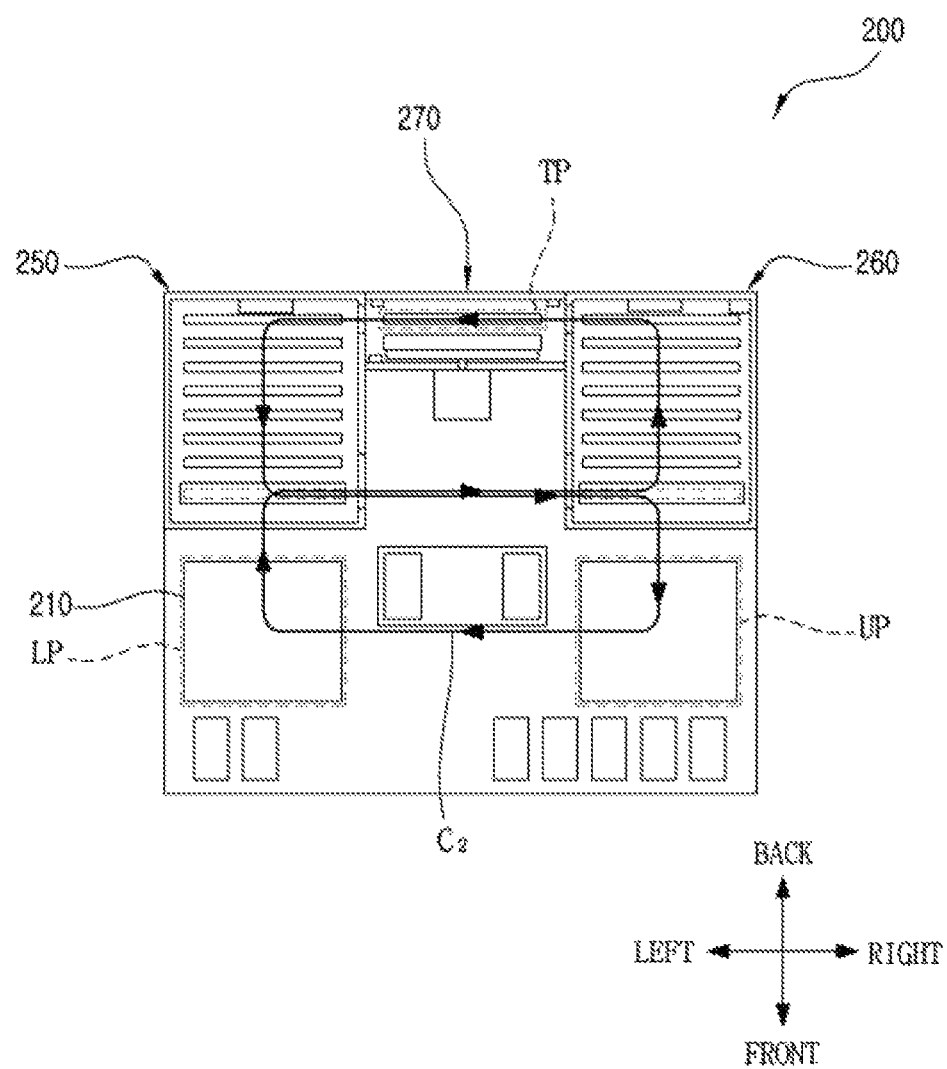

In the above set temperature, as referenced in FIG. 4, the test tray 210 circulates along the second circulation path (C2) leading the loading position (LP), the inside of the first chamber 250, the inside of the second chamber 260, <the test tray 210 is transferred in parallel from the inside of the second chamber 260 to the backward>, the test position (TP) of the inside of the test chamber 270, the inside of the first chamber 250, <the test tray 210 is transferred in parallel from the inside of the first chamber 250 to the forward>, the inside of the second chamber 260 and the unloading position (UP) to the loading position (LP) sequentially. Hereinafter, the above mentioned second circulation path (C2) will be described in more detail.

Figure 6:
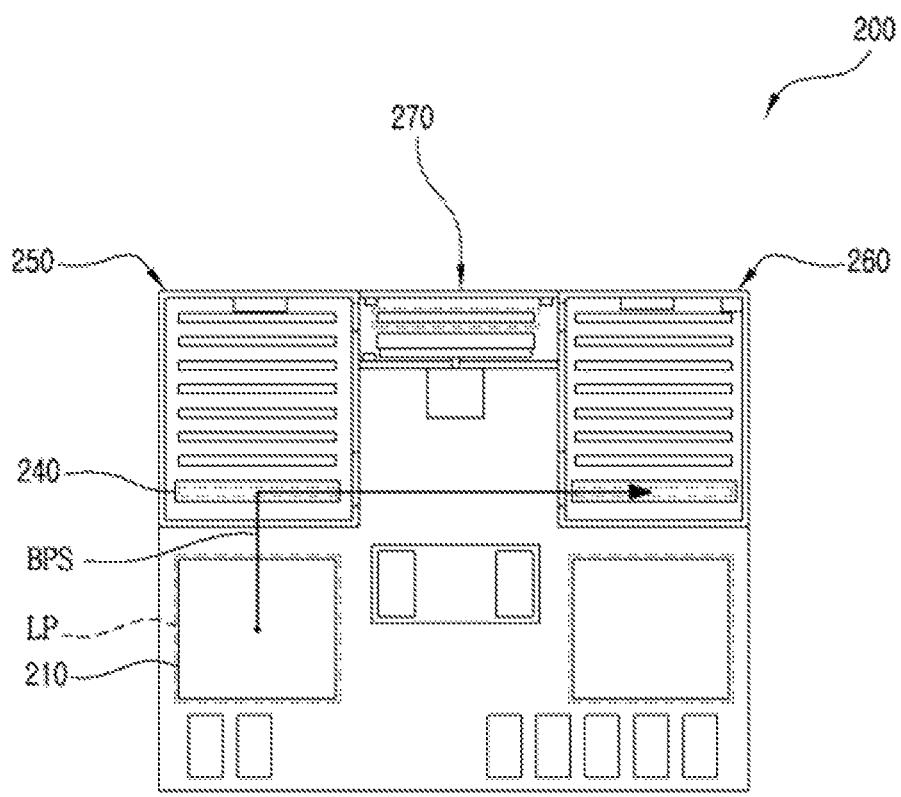

First of all, referring to FIG. 6, the test tray 210 is transferred from the loading position (LP) to the first chamber 250, and after converting in position from the horizontal state to the vertical state by the first position converter 240 in the inside of the first chamber 250, is transferred to the bypass section (BPS) leading to the inside of the second chamber 260, without passing through the inside of the test chamber 270.

Figure 7:
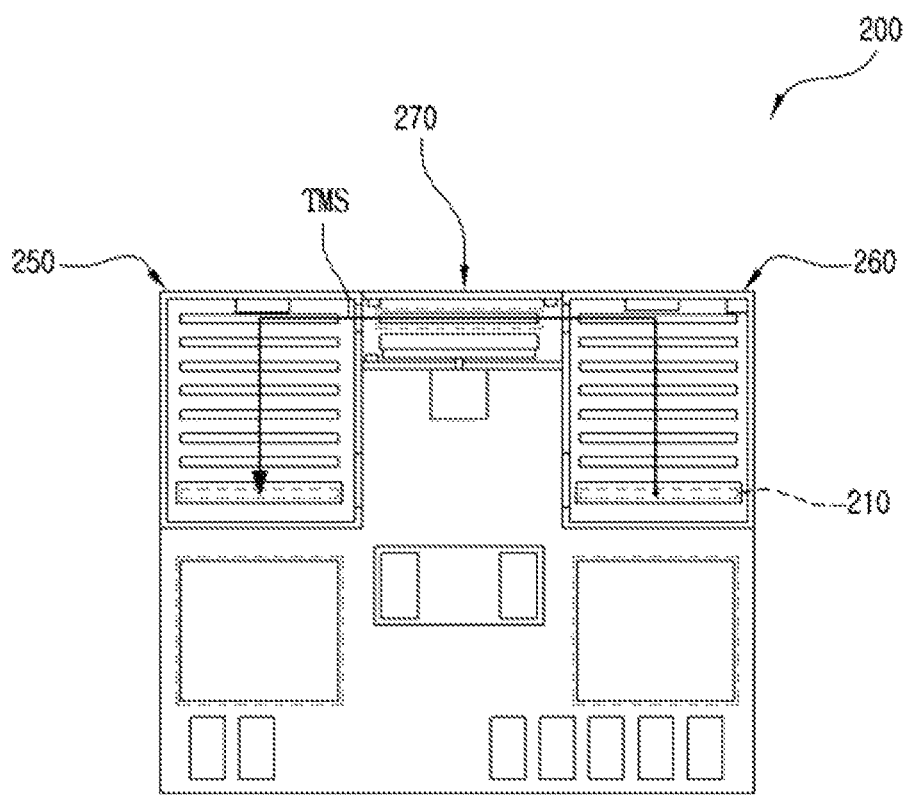
Figure 7:
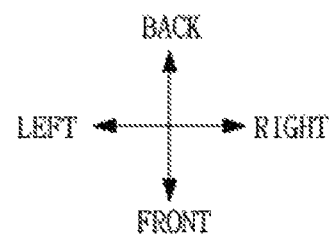

Next, referring to FIG. 7, the test tray 210 is transferred to the section (TMS) passing through the second chamber 260, the test chamber 270 and the inside of the first chamber 250 sequentially. At this time, the second chamber 260 has a function as a soak chamber, and the first chamber 250 has a function as a desoak chamber. Here, the test tray 210 is transferred in parallel to the backward in the inside of the second chamber 260 and is transferred in parallel to the forward in the inside of the first chamber 250. Therefore, the semiconductor devices assimilated to the high temperature while passing through the second chamber 260 are tested by the tester in the inside of the test chamber 270 and then return to the room temperature while passing through the first chamber 250. For reference, by supplying the ambient air of the room temperature to the inside of the first chamber 250, the semiconductor devices of the high temperature are cooled down close to the room temperature in the inside of the first chamber 250.

Figure 8:
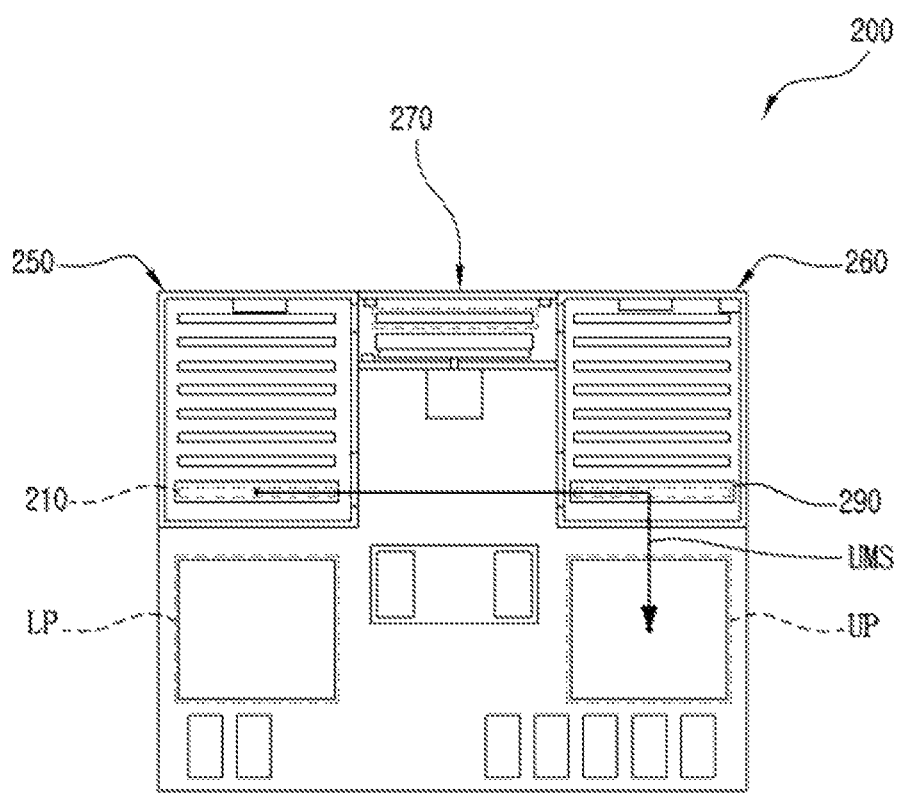

Subsequently, referring to FIG. 8, the test tray 210 which is finished in transferring in parallel from the inside of the first chamber 250 to the forward is transferred to the inside of the second chamber 260 without passing through the inside of the test chamber 270, and then returns to the horizontal state by the second position converter 290 and is transferred to the unloading movement section (UMS) leading to the unloading position (UP).

Then, a single circulation is completed when the test tray in which the semiconductor devices finished in unloading at the unloading position (UP) is transferred to the loading position (LP).

In the present embodiment, In the present embodiment, it has been described by way of example that the first position converter 240 is equipped in the inside of the first chamber 250, and the second position converter 290 is equipped in the inside of the second chamber 260. Accordingly, at the bypass section (BPS) on the second circulation path (C2), the test tray 210 passes through the inside of the first chamber 250, and at the unloading movement section (UMS), the test tray 210 passes through the inside of the second chamber 260. As shown in FIG. 5, however, in case where the first position converter 240A is equipped in the outside of the first chamber 250A and also the second position converter is equipped in the outside of the second chamber, the test tray is not required to pass through the first chamber 250A at the bypass section (BPS), and is not required to pass through the second chamber at the unloading movement section (UMS).

Consequently, the transfer direction of the test tray 210 passing through the sections of the second chamber 260, the test chamber 270 and the inside of the first chamber 250 sequentially at the second circulation path (C2) is different from the transfer direction of the test tray 210 passing through the sections of the first chamber 250, the test chamber 270 and the inside of the second chamber 260 sequentially at the first circulation path (C1).

Figure 9:
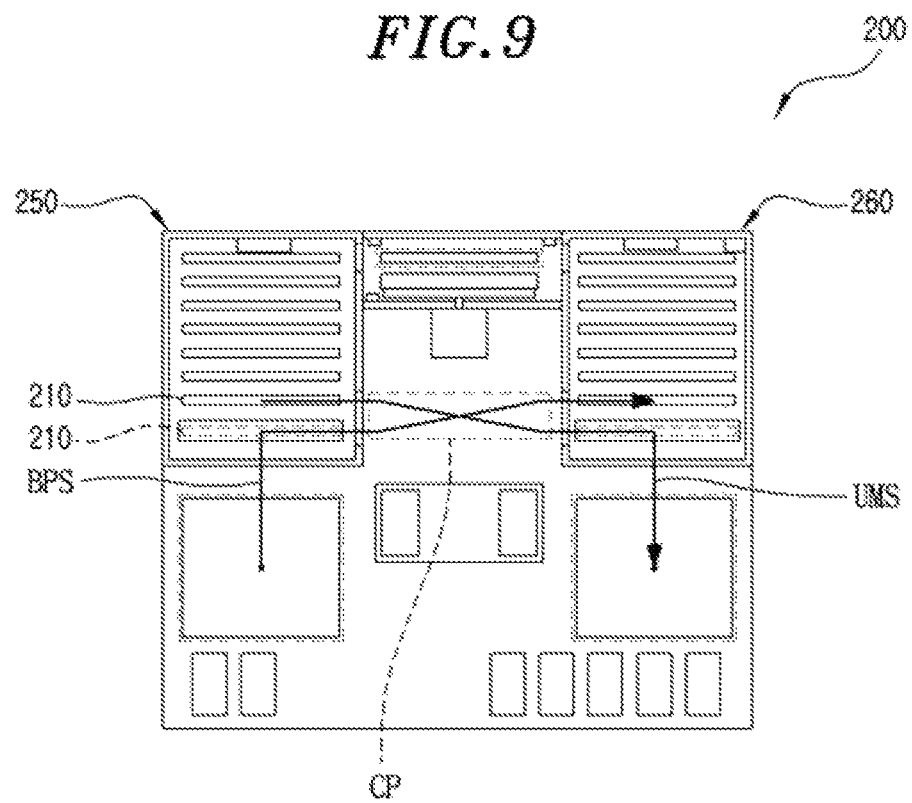

Meanwhile, the transfer directions of the test trays 210 which are scheduled to transfer at the bypass section (BPS) and the unloading movement section (UMS) respectively in the second circulation path (C2) may be interfered at the same section. In order to prevent this interference, it is necessary to wait the test tray 210 at any one side, and this need may drop somewhat the processing capacity of the test handler 200. As shown in FIG. 9, therefore, the bypass section (BPS) and the unloading movement section (UMS) may be implemented so as to have different paths. In this case, as the bypass section (BPS) and the unloading movement section (UMS) are spaced apart each other except for the cross point (CP) where the bypass section (BPS) and the unloading movement section (UMS) are intersected, it is possible to minimize the waiting time for transferring the test tray 210. Here, the cross point (CP) may be between the first chamber 250 and the second chamber 260 as shown in FIG. 9, but depending on the embodiment, may be implemented optionally within the inside of the first chamber 250 or in the inside of the second chamber 260.

Second Embodiment

Figure 10:
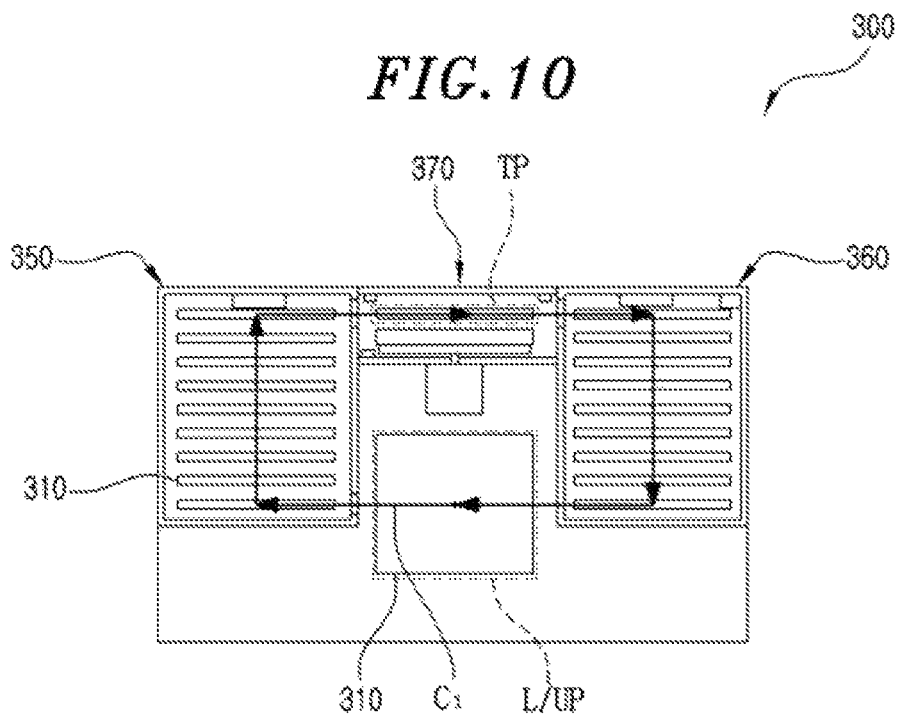
FIG. 10 and FIG. 11 are reference views illustrating a circulation path of a test tray of the test handler in accordance with the second embodiment of the present invention.
Figure 11:
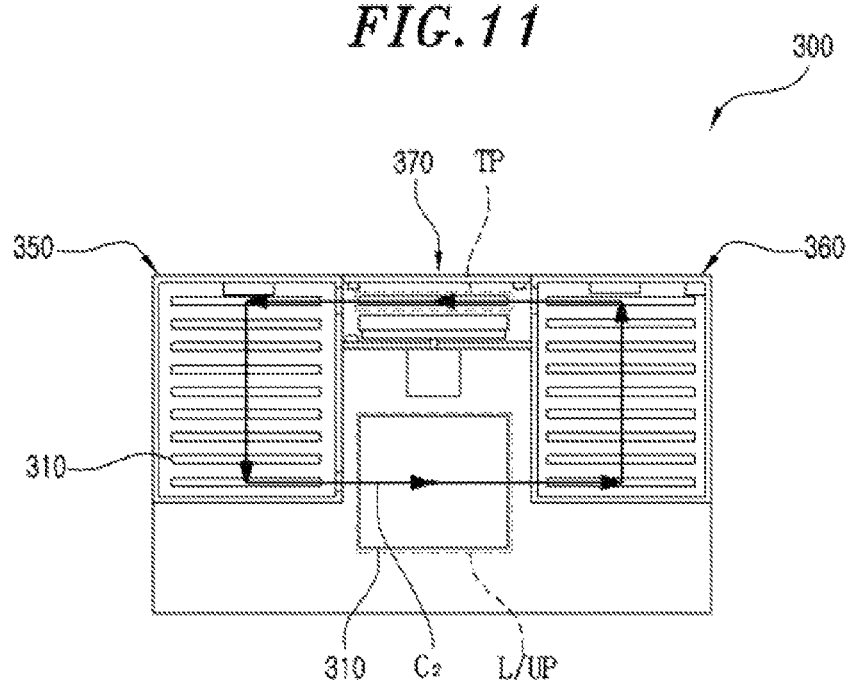

FIG. 10 and FIG. 11 show a first circulation path (C1) and a second circulation path (C2) of a test tray 310 of a test handler 300 in accordance with a second embodiment of the present invention.

In the test handler 300 in accordance with the present embodiment, loading and unloading are made at the same location, as Korean Patent Laid-Open Publication No. 10-1998-056230 or Korean Registered Patent No. 10-0560729.

In this case, as referenced in FIG. 10, the first circulation path (C1) is a closed path leading from a loading/unloading position (L/UP), an inside of a first chamber 350, a test position of an inside of a test chamber 370 and an inside of a second chamber 360 sequentially to the loading/unloading position (L/UP). As referenced in FIG. 11, the second circulation path (C2) is a closed path leading from the loading/unloading position (L/UP), the inside of the second chamber 360, the test position of the inside of the test chamber 370 and the inside of the first chamber 350 sequentially to the loading/unloading position (L/UP).

Third Embodiment

Figure 12:
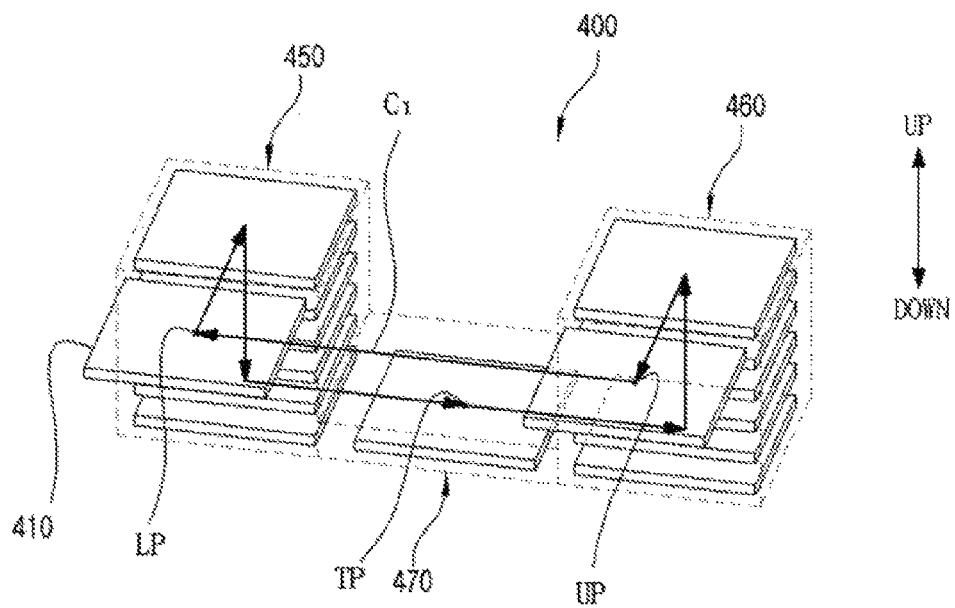
FIG. 12 to FIG. 14 are reference views illustrating a circulation path of a test tray of the test handler in accordance with a third embodiment of the present invention.
Figure 13:
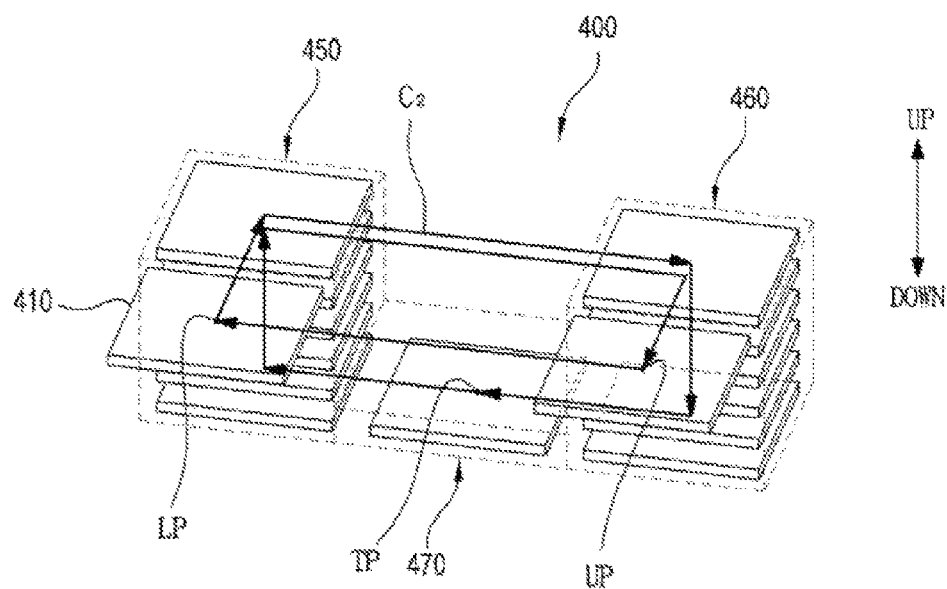

FIG. 12 and FIG. 13 show a first circulation path (C1) and a second circulation path (C2) of a test handler 400 in accordance with a third embodiment of the present invention.

The test handler 400 in accordance with the present embodiment is an under-head docking type, and there is no conversion of position of a test tray 410.

In the present embodiment, as referenced in FIG. 12, the first circulation path (C1) is a close path leading from a loading position (LP), an inside of a first chamber 450, <the test tray 410 is transferred in parallel from the inside of the first chamber 450 to the downward>, a test position (TP) of an inside of a test chamber 470, an inside of a second chamber 460, <the test tray 410 is transferred in parallel from the inside of the second chamber 460 to the upward>, and an unloading position (UP) sequentially to the loading position (LP). As referenced in FIG. 13, the second circulation path (C2) is a close path leading from the loading position (LP), the inside of a first chamber 450, the inside of the second chamber 460, <the test tray 410 is transferred in parallel from the inside of the second chamber 460 to the downward>, the test position (TP) of the inside of the test chamber 470, the inside of the first chamber 450, <the test tray 410 is transferred in parallel from the inside of the first chamber 450 to the upward>, the inside of the second chamber 460 and the unloading position (UP) sequentially to the loading position (LP).

Figure 14:
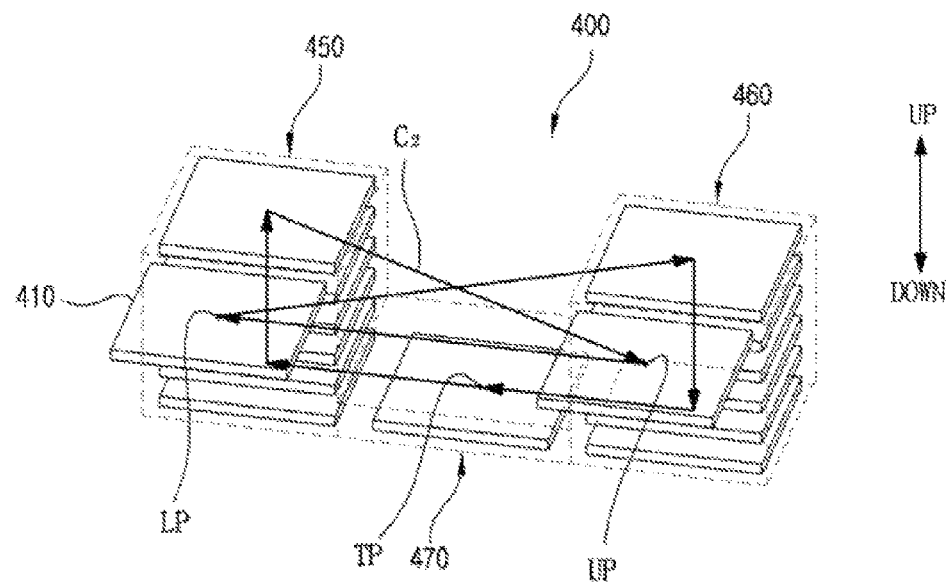

Depending on the embodiments, as shown in FIG. 14, the second circulation path (C2) may be implemented by a closed path leading the loading position (LP), the inside of the second chamber 460, <the test tray 410 is transferred in parallel from the inside of the second chamber 460 to the downward>, the test position (TP) of the inside of the test chamber 470, the inside of the first chamber 450, (the test tray 410 is transferred in parallel from the first chamber 450 to the upward), and the unloading position (UP) sequentially to the loading position (LP).

As set forth above, while the present invention has been described in detail through the embodiments with reference to the accompanying drawings, it is to be understood that as the embodiments are described only with preferred examples of the present invention, the scope of the present invention is not limited to the described embodiments and is defined by the claims and equivalents.

What is claimed is:
1. A test handler, comprising:
   a test tray for circulating along a first circulation path or a second circulation path, depending on a temperature condition of test, the test tray having semiconductor devices mounted thereon;

a device transfer portion for transferring the semiconductor devices to be tested from a customer tray to the test tray located at a loading position, or transferring the semiconductor devices finished in testing from the test tray located at an unloading position to the customer tray by classifying the semiconductor devices according to the test result;

a plurality of transporters for circulating the test tray having the semiconductor devices to be tested mounted thereon along the first circulation path or the second circulation path by an operation of the device transfer portion;

a first chamber for accommodating the test tray circulating along the first circulation path or the second circulation path by the plurality of transporters, the first chamber being provided to assimilate the semiconductor devices mounted on the test tray to a temperature corresponding to a first temperature condition;

at least one or more first thermo-regulators for assimilating an inside of the first chamber to the first temperature condition;

a second chamber for accommodating the test tray circulating along the first circulation path or the second circulation path by the plurality of transporters, the second chamber being provided to assimilate the semiconductor devices mounted on the test tray to a temperature corresponding to a second temperature condition;

at least one or more thermo-regulators for assimilating the inside of the second chamber to the second temperature condition;

a test chamber which is disposed between the first chamber and the second chamber on the first circulation path and the second circulation path, the test chamber being provided for supporting tests of the semiconductor devices mounted on the test tray accommodated therein;

at least one or more third thermo-regulators for assimilating the inside of the test chamber to a temperature condition of test; and a controller for controlling the plurality of transporters so as for the test tray to circulate along the first circulation path or the second circulation path, wherein the first temperature condition and the second temperature condition vary respectively according to settings, and the first temperature condition and the second temperature condition are different from each other, wherein the first circulation path and the second circulation path are different from each other in a transfer direction of the test tray at least in some sections, and wherein the first circulation path has a section where the test tray passes through the inside of the first chamber, the inside of the test chamber and the inside of the second chamber sequentially, and the second circulation path has a section where the test tray passes through the inside of the second chamber, the inside of the test chamber and the inside of the first chamber sequentially.

2. The test handler of claim 1, wherein the second circulation path has a bypass section where the test tray is transferred from the loading position to the inside of the second chamber, and at least one or more bypass transporters for transferring the test tray from the loading position to the inside of the second chamber are included among the plurality of transporters.

3. The test handler of claim 2, wherein the bypass section is a section where the test tray is transferred from the loading position to the inside of the second chamber via the inside of the first chamber, the first chamber is equipped with a taking-out door which opens and closes a taking-out hole where the test tray is taken out from the first chamber at the bypass section, and the second chamber is equipped with a taking-in door which opens and closes a taking-in door where the test tray is taken in to the second chamber at the bypass section.

4. The test handler of claim 1, further comprising:

a first opening and closing door which is provided for cross communicating or blocking the inside of the first chamber and the inside of the test chamber, and a second opening and closing door which is provided for cross communicating or blocking the inside of the test chamber and the inside of the second chamber.

5. A circulation method of a test tray in a test handler, the method comprising:

in case of a first mode of test of temperature condition, firstly circulating the test tray along a first circulation path; and in case of a second mode of test of temperature condition different from the first mode, secondly circulating the test tray along a second circulation path, wherein the first circulation path and the second circulation path are different from each other in a transfer direction of the test tray at least in some sections, and wherein the first circulation path has a section where the test tray passes through an inside of a first chamber, an inside of a test chamber and an inside of a second chamber sequentially and the second circulation path has a section where the test tray passes through the inside of the second chamber, the inside of the test chamber and the inside of the first chamber sequentially.

6. The circulation method of claim 5, wherein the second circulation path has a bypass section where the test tray is transferred from a loading position (a position where semiconductor devices are loaded on the test tray) to the inside of the second chamber without passing through the inside of the test chamber, and an unloading transfer section where the test tray is transferred from the first chamber to an unloading position (a position where semiconductor devices are unloaded from the test tray) without passing through the inside of the test chamber.

7. The circulation method of claim 6, wherein at least a portion of the portions where the transfer directions of the test tray are same in the bypass section and the unloading transfer section are spaced apart from each other.

8. A test handler, comprising:

a test tray having semiconductor devices mounted thereon, wherein the test tray is configured to be transferred along a first circulation path in a first mode where semiconductor devices are tested by a first temperature, and be transferred along a second circulation path in a second mode where the semiconductor devices are tested by a second temperature different from the first temperature;

a device transfer portion for transferring the semiconductor devices to be tested from a customer tray to the test tray, or transferring the semiconductor devices finished in testing from the test tray to the customer tray;

a plurality of transporters for transferring the test tray;

a controller for controlling the plurality of transporters;

a first chamber and a second chamber for controlling a temperature of the semiconductor devices mounted on the test tray; and a test chamber in which the semiconductor devices are tested, the test chamber being provided between the first chamber and the second chamber, wherein the test handler operates continuously while switching the first mode and the second mode to and from each other, and wherein the first circulation path has a section where the test tray passes through an inside of the first chamber, an inside of the test chamber and an inside of the second chamber sequentially, and the second circulation path has a section where the test tray passes through the inside of the second chamber, the inside of the test chamber and the inside of the first chamber sequentially.

9. The test handler of claim 8, wherein in case of the first mode of test, the first chamber is adjusted to the first temperature, and the second chamber is adjusted to a temperature which is required for the semiconductor devices to return from the first temperature to a room temperature, and in case of the second mode of test after the first mode of test, the second chamber is adjusted to the second temperature, and the first chamber is adjusted to a temperature which is required for the semiconductor devices to return from the second temperature to the room temperature.

10. The test handler of claim 9, wherein a difference between the temperature which is required for the semiconductor devices to return from the first temperature to the room temperature and the second temperature is smaller than the difference between the first temperature and the second temperature.

\* \* \* \* \*